United States Patent [19]
Moslehi

[11] Patent Number: 6,132,805
[45] Date of Patent: Oct. 17, 2000

[54] SHUTTER FOR THIN-FILM PROCESSING EQUIPMENT

[75] Inventor: Mehrdad M. Moslehi, Los Altos, Calif.

[73] Assignee: CVC Products, Inc., Rochester, N.Y.

[21] Appl. No.: 09/175,487

[22] Filed: Oct. 20, 1998

[51] Int. Cl.[7] .............................. C23C 14/00; C23C 16/50
[52] U.S. Cl. ................ 427/248.1; 118/720; 118/723 FI; 118/723 E; 118/726; 204/192.34; 204/298.11
[58] Field of Search ......................... 427/248.1; 118/720, 118/723 FI, 723 E, 726; 204/192.34, 298.11

[56] References Cited

U.S. PATENT DOCUMENTS

| | | | |
|---|---|---|---|
| 3,636,916 | 1/1972 | Thelen | 118/726 |
| 3,895,602 | 7/1975 | Bobenrieth | 118/726 |
| 4,761,199 | 8/1988 | Sato | 204/192.34 |
| 4,950,376 | 8/1990 | Hayashi | 204/192.32 |
| 4,971,653 | 11/1990 | Powell et al. | |
| 5,192,849 | 3/1993 | Moslehi . | |
| 5,221,636 | 6/1993 | Landreau | 204/298.11 |
| 5,358,615 | 10/1994 | Grant | 204/298.11 |
| 5,746,828 | 5/1998 | Boulaev . | |
| 6,011,904 | 1/2000 | Mattord | 118/726 |

*Primary Examiner*—Richard Bueker
*Attorney, Agent, or Firm*—Eugene Stephens & Associates

[57] ABSTRACT

A shutter assembly located substantially within a thin-film processing chamber includes a plurality of articulatable components that are movable between open and closed positions within the chamber. The articulatable components are preferably arranged in the form of an iris to regulate a size of an opening centered along said central axis. The shutter assembly can be used to isolate transmissions between a process energy source such as a PVD target and a substrate or to limit a range of incidence angles at which the transmissions reach the substrate. The shutter apparatus of this invention does not add any area to the footprint of processing equipment, enables very fast shuttering between open and closed positions, and enables enhanced process control.

57 Claims, 8 Drawing Sheets

SHUTTER FOR THIN-FILM PROCESSING EQUIPMENT

TECHNICAL FIELD

Within thin-film processing environments, wafers and other substrates are processed by exposure to the effects of process energy sources, such as electrically charged plasma. Shutters can be activated to confine or interrupt plasma distributions, including line-of-sight transmissions between physical-vapor deposition (PVD) target electrodes and substrates.

BACKGROUND

Shutters perform a specialized function in thin-film processing equipment during low-pressure processing operations by regulating a division of space within low-pressure processing chambers. Typically, a first region of the divisible space is occupied by a substrate support, and a second region of the divisible space is occupied by a process energy source such as a physical-vapor deposition target electrode. Shutters can be activated to temporarily divide the thin-film processing chambers into the two separate regions of space for such purposes as cleaning the substrates, preparing the targets, or timing operations (such as end-pointing or terminating a deposition process) involving plasma effects between the targets and substrates.

During substrate cleaning operations, the shutter is closed and grounded, and a bias voltage (usually an RF voltage) is applied to the substrate. Plasma generated and confined within the first region of the processing chamber between the shutter and the substrate impinges on the substrate for surface preparation such as removing impurities. A similar bias voltage can be applied to the PVD target behind a closed shutter, confining plasma within the second region of the processing chamber between the shutter and the target for removing target surface impurities or for removing a surface layer of a PVD target. Process transients can be reduced by stabilizing the PVD plasma with the shutter closed in advance of opening the shutter, and the timing of processing operations can be controlled by opening and closing the shutter. This can result in improved process repeatability.

Typical PVD shutters have an extendible arm (such as a horizontally actuated linear arm) that enters the low-pressure processing chamber through a shutter access port. A shutter actuator drive extends the shutter plate across the processing chamber (shutter plate moves in parallel to the PVD target and the substrate from one side of the PVD process chamber in order to move into a closed position) to divide the chamber space. The space is rejoined by withdrawing the shutter plate through the shutter access port. Using the prior art shutter designs, extending (closing) and withdrawing (opening) the shutter can take a length of time from at least a few seconds up to tens of seconds, which can be a significant portion of a processing cycle. Also, extending and withdrawing the shutter across the substrate during processing operations (such as at the beginning and/or at the end of the PVD process) can disturb plasma symmetry and produce uneven depositions across the substrate. This is due to the fact that shutter extension and withdrawal operations take place from one side (shutter access port).

The actuation required to admit the shutter plate and to maintain the low-pressure processing environment adds considerable cost and complexity to the thin-film processing chambers. In addition, the shutter plate and its drive components add to the overall footprint of the processing chamber. This is due to the fact that the prior art shutters attach externally to a vacuum access port on the processing chamber and occupy relatively large area footprints.

SUMMARY OF INVENTION

The zero-footprint shutter envisioned by this invention is mounted entirely within a low-pressure processing chamber such as a PVD process chamber, which eliminates the need for a special vacuum access port and reduces the overall footprint of the chamber and shutter combination (no additional footprint required for an external shutter assembly). A non-contacting drive (or an actuation mechanism utilizing a vacuum feedthrough such as ferrofluidic feedthrough) outside the processing chamber preferably controls the opening and closing of the shutter while maintaining the vacuum integrity of the processing chamber.

One example of such a shutter for processing substrates within a thin-film processing chamber includes a plurality of plates mounted within the processing chamber at a location that divides an axial column of chamber space into two regions. The plates can be moved together between an open position that joins the two regions of space and a closed position that separates and isolates the two regions of space. The open and closed positions of the plates are preferably symmetrical with respect to a central axis of the axial column of space within the chamber.

Preferably, the adjacent plates overlap each other by variable amounts that regulate a size of an opening centered along the central axis. Pivots (such as flexible spring pivots) support outer ends of the plates next to an internal periphery of the processing chamber, and inner ends of the plates are pivoted toward (to open) or away from (to close) the periphery for adjusting the amount of overlap between the plates. At the open position, the amount of overlap is maximized and the shutter is open; and at the closed position, the amount of overlap is minimized and the shutter is closed.

The invention can also be described as a shuttering system for a thin-film processing chamber that does not add to the equipment footprint. A shutter assembly located entirely within the thin-film processing chamber such as a PVD process chamber regulates line-of-sight transmissions from a PVD target electrode to a substrate. Articulatable components of the shutter assembly move between a position that opens the line-of-sight transmissions from the PVD target electrode to the substrate and a position that closes the same line-of-sight transmissions, resulting in mutual isolation at the target and the substrate. A drive mechanism located outside the thin-film processing chamber moves the articulatable components between the open and closed positions. The drive mechanism can be coupled to the shutter components either via a vacuum feedthrough (such as a ferrofluidic feedthrough) or a magnetically coupled actuator.

The articulatable components are preferably arranged in a form of an iris for regulating the size of an opening that is centered and concentric with respect to a common central axis of the target electrode and the substrate. The iris, which is entirely contained within the processing chamber, preferably communicates magnetically (or via a ferrofluidic feedthrough actuator) with the drive mechanism located outside the process chamber to eliminate any need to breach the vacuum integrity of the processing chamber for performing the shuttering function. The iris plates are preferably connected to spring-actuated flexible pivots near the internal periphery of the process chamber.

The invention can also be carried out as a method of processing a substrate within a thin-film processing chamber such as a PVD process chamber. The shutter is initially closed to block line-of-sight transmissions along an axis between a target electrode and a substrate within the thin-film processing chamber. An electrical bias such as an RF bias on the target can be used to generate a plasma in the vicinity of the PVD target electrode, and the shutter is maintained in a closed position until the plasma stabilizes and/or the target surface conditioning is completed. The shutter is then progressively opened symmetrically about the central axis for exposing the substrate to line-of-sight transmissions between the target electrode and the substrate. The shutter closure and opening actions for the apparatus of this invention can be performed rapidly in a fraction of a second or less than a few seconds.

At the conclusion of processing, the shutter can be closed symmetrically about the central axis to interrupt the line-of-sight exposure of the substrate and to stop the deposition process onto the substrate. The symmetric opening and closing of the shutter provide for more uniformly exposing the substrate to the line-of-sight transmissions. For instance, deposition of very thin films (e.g., thicknesses less than 100 angstroms) can be performed by using the shutter to determine the start and stop times for the deposition process (in order to improve repeatability and process control). The shutter apparatus of this invention enables this mode of operation without causing deposition asymmetry on the substrate. Potential for contamination is reduced by controlling the shutter actuation operations without any particle-generating mechanical operations within the chamber. Also, the space requirements for the thin-film process equipment are reduced by mounting the shutter entirely within the processing chamber.

In addition to regulating plasma distributions between the PVD layer and the substrate within low-pressure processing chambers, modified versions of the shutter can also be used to perform other functions such as collimation of line-of-sight transmissions from a target electrode to a substrate. Openings (such as circular holes) are formed in the shutter plates to limit a range of incident angles at which line-of-sight transmissions impinge upon the substrate. For example, the shutter plates can be formed with a known ratio of thickness in relation to the size of the openings to achieve a desired collimation aspect ratio.

In summary, the shutter apparatus of the invention can provide a number of advantages including: (1) no added footprint to the processing equipment, (2) fast axis-symmetrical operation, (3) enhanced vacuum integrity, (4) reduced cost, (5) reduced particles, (6) enhanced reliability, and (7) elimination of the need for shutter access port.

DETAILED DESCRIPTION

Figure 1:
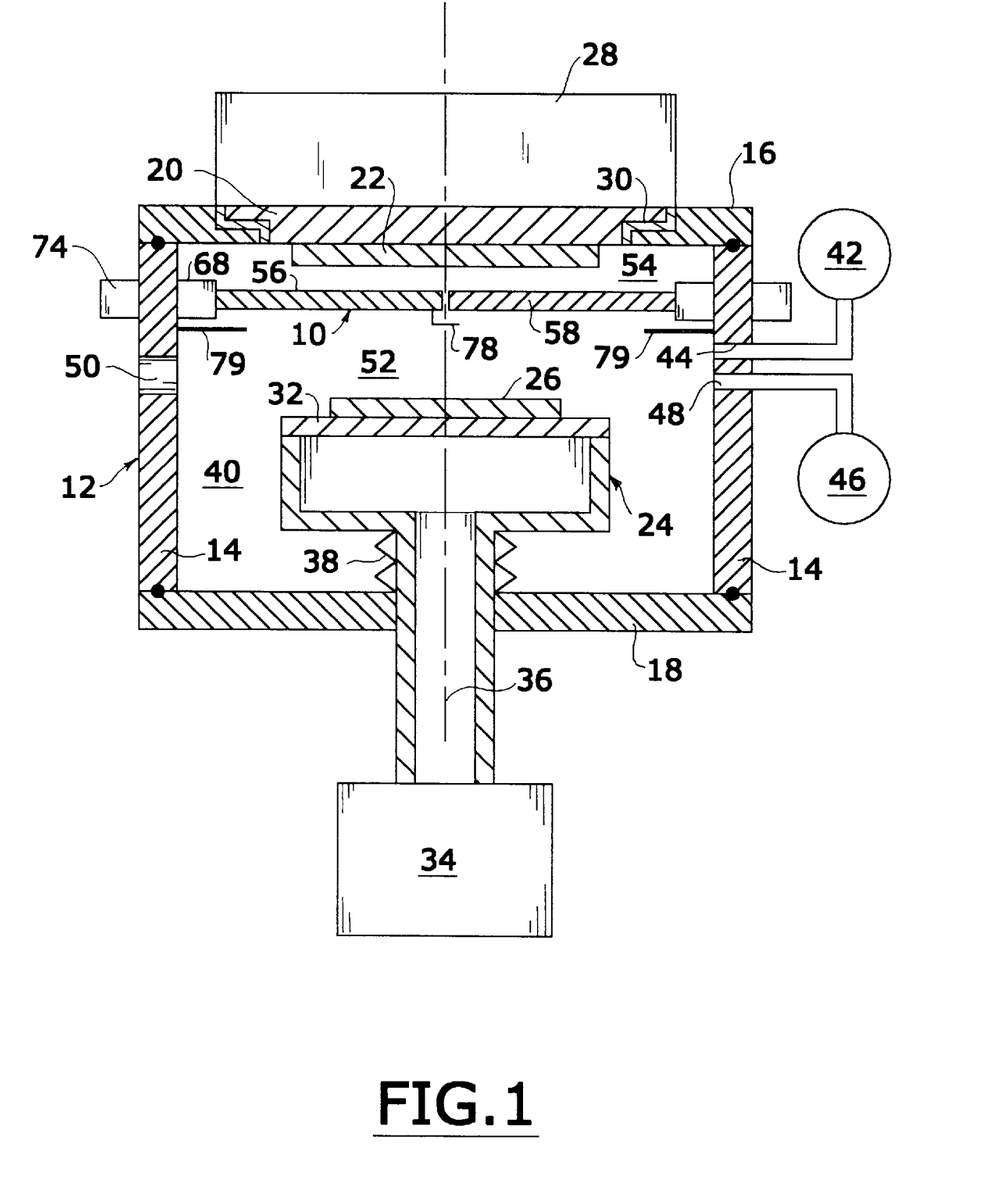
FIG. 1 is a cross-sectional schematic view of a low-pressure processing chamber (such as a PVD chamber) including a shutter assembly for regulating a division of space within the chamber, such as the space or process volume between a PVD target and a substrate.

A shuttering system 10 is incorporated into a thin-film processing chamber 12 as shown in FIG. 1 to better regulate plasma operations. The chamber 12, which is particularly suitable for such plasma operations as physical-vapor deposition (PVD) processes including plasma sputtering and ion-beam deposition methods, has an annular body 14 and top and bottom end plates 16 and 18. Through the top end plate 16, an electrode backing plate 20 supports a target 22 that provides a source of deposition material for physical-vapor deposition processes. Through the bottom end plate 18, a chuck assembly 24 supports a substrate 26 in positions for receiving a coating of the deposition material. The chuck assembly 24 may simply hold the substrate, provide substrate heating, or enable substrate cooling during deposition or etch processes.

During deposition operations, a magnetron 28 provides electrical energy and regulates erosion of the target 22. The magnetron can be a DC magnetron or an RF magnetron PVD energy source. A non-magnetron energy source such as an RF diode can also the used. The electrode backing plate 20, which receives power for target sputtering, is electrically isolated from the top end plate 16 by an insulating ring 30.

The substrate 26 is supported on a mounting table 32 that can either be arranged to regulate substrate temperature or simply be used as substrate support without any means for active temperature control. For example, the table 32 can incorporate a heating unit, a cooling unit, or both. Heat exchanges between the table 32 and the substrate 26 can be facilitated by a heat-transfer gas at the contact interface. More detailed examples of chuck assemblies for regulating substrate temperature are found in commonly assigned U.S. patent application Ser. No. 08/938,293, filed Sep. 26, 1997, entitled "Two-Stage Sealing System for Thermally Conductive Chuck", and U.S. patent application Ser. No. 08/975,626, filed Nov. 21, 1997, entitled "Thermally Conductive Chuck for Vacuum Processor", both of which are hereby incorporated by reference.

A drive mechanism 34 provides for translating the chuck assembly 24 along a central axis 36 toward or away from the target 22 in order to adjust the substrate-to-target spacing. Bellows 38 seals the chuck assembly 24 to the bottom end plate 18 of the processing chamber 12 to accommodate a range of chuck assembly translation and to isolate interior components of the chuck assembly 24 from a column of evacuatable space 40 within the processing chamber 12.

Process gasses 42 are admitted into the processing chamber 12 through inlet port 44 or through a gas injection ring at or near the top plate 16, and a vacuum pump 46 (such as a cryogenic pump and/or a turbo-molecular pump) connected to an outlet port 48 evacuates air and used process gasses from the processing chamber 12. An access port 50 provides a resealable opening for moving the substrate 26 into and out of the processing chamber 12 (e.g., using a cluster tool central wafer handler).

Figure 2A:
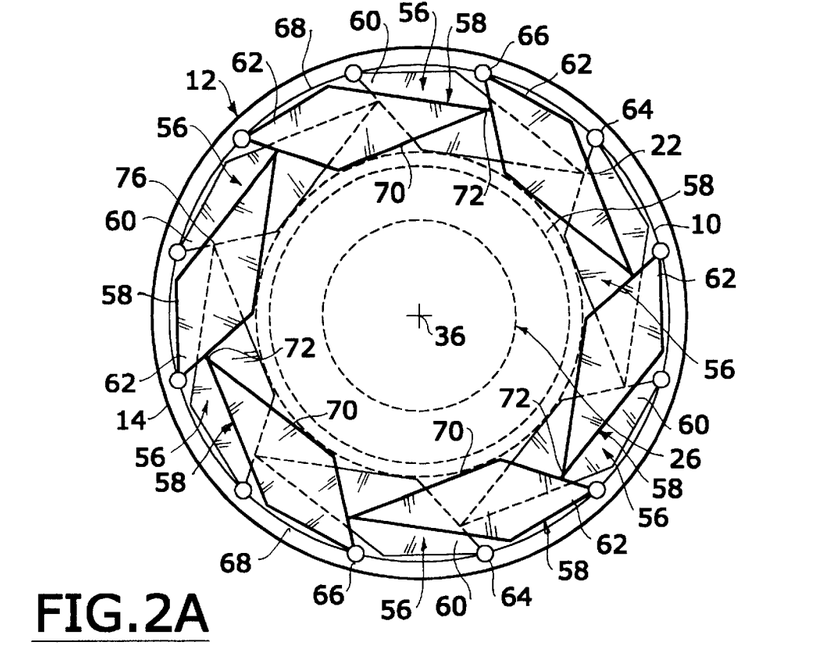
FIGS. 2A and 2B are plan views of the shutter assembly in open and closed positions.
Figure 2B:
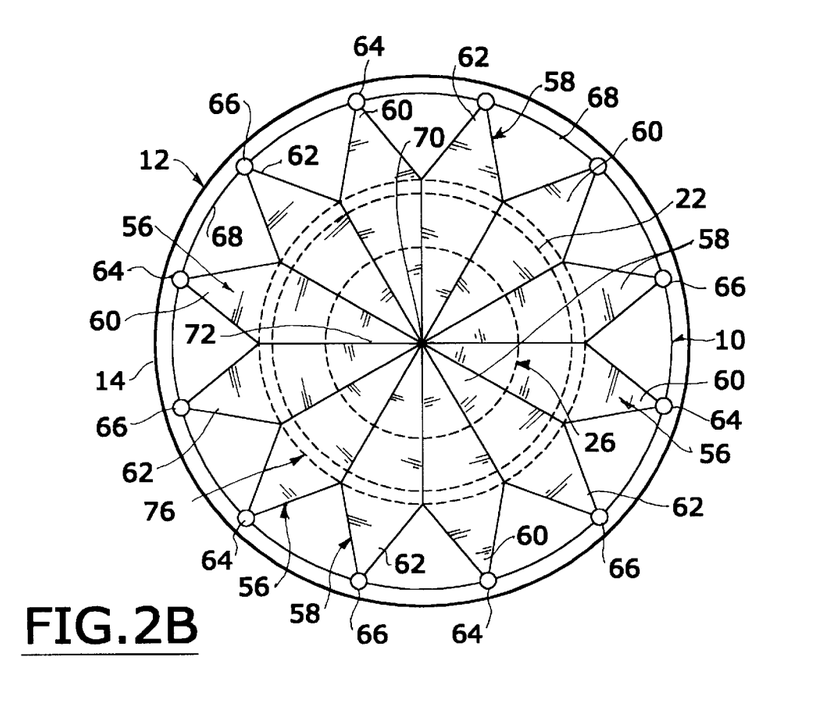

In the PVD process chamber 12, the shutter assembly 10 preferably divides the column of evacuatable space 40 into a first region 52 including the substrate 26 and a second region 54 including the target 22. The shutter assembly 10 is preferably connected to an electrical ground. FIGS. 2A and 2B provide an axial view of one embodiment of the shutter assembly 10 in open and closed positions. In this embodiment, two sets of overlapping plates 56 and 58 (typically made of 0.5 mm to 3 mm thick metallic plates) alternately stagger in height or vertical positions (e.g., arranged in two closely spaced parallel planes) along the central axis 36. In the example shown in FIGS. 2A and 2B, the shutter assembly comprises six shutter plates 56 at a first vertical position and six additional shutter plates 58 at a second vertical position. The numbers of shutter plates and shutter planes may vary depending on the PVD chamber, target, and substrate dimensions.

Outer ends 60 and 62 of the plates 56 and 58 are mounted on pivots 64 and 66 (preferably pivots with rotational spring forces) and supported by a common actuator ring 68 that is rotationally mounted on a periphery of the processing chamber 12 and connected to an electrical ground potential. Inner sections 70 and 72 of the plates 56 and 58 pivot toward or away from the periphery of the processing chamber 12 for adjusting the amount of overlap between the plates 56 and 58 and for adjusting the amount of line-of-sight view between the substrate 26 and target 22. The spacing between the two shutter planes (for plates 56 and 58) is preferably between 0.5 mm and 5 mm.

A magnetic drive mechanism 74 (see FIG. 1) interacts with the actuator ring 68 to pivot the plates 56 and 58 between an open position shown in FIG. 2A and a closed position shown in FIG. 2B. The energizing components of the drive mechanism 74 are mounted outside the processing chamber 12 to eliminate any impact on vacuum integrity of the evacuatable space 40 such as by vacuum leak or outgassing. In the open position, the plates 56 and 58 envelop an opening 76 that is centered with respect to the central axis 36 and is sized in diameter larger than either the wafer 26 or the target 22. The plates 56 and 58 are normally actuated into the open position, and the drive mechanism 74 moves the plates into the closed position. The opening 76 is progressively and axially symmetrically reducible in size from the open position of maximum overlap between the plates 56 and 58 to the closed position of minimum overlap between the plates 56 and 58. The shutter actuator 74 is preferably configured to be mounted on a small portion of the process chamber 12 periphery to engage the actuator ring 68 for rotational actuation of pivots 64 and 66. The shutter actuator 74 may be designed to operate either via magnetic coupling through chamber 12 or via vacuum feedthrough mechanical coupling.

To avoid interference effects between the inner sections 70 and 72 of the plates 56 and 58 at the closed position, the inner sections 70 and 72 are slightly spaced from the central axis 36. An extended portion 78 of one of the plates 58 (see FIG. 1) overlaps the inner sections 70 and 72 at a third height to block line-of-sight transmissions from the target 22 to the substrate 56 along the central axis 36. The actuator ring 68 can also be arranged to block line-of-sight transmissions between the outer ends 60 and 62 of the plates 56 and 58. Preferably, this function is performed by a separate plate-shaped ring 79 (see FIG. 1) located at a third height below the shutter assembly 10 and having an outer diameter equal or close to the internal diameter of process chamber wall 14 and an opening with an internal diameter close or equal to the diameter of shutter opening circle 76. The plate-shaped ring 79 enables complete partitioning of the process medium into upper space 54 and lower space 52 when shutter assembly 10 is closed.

Figure 3A:
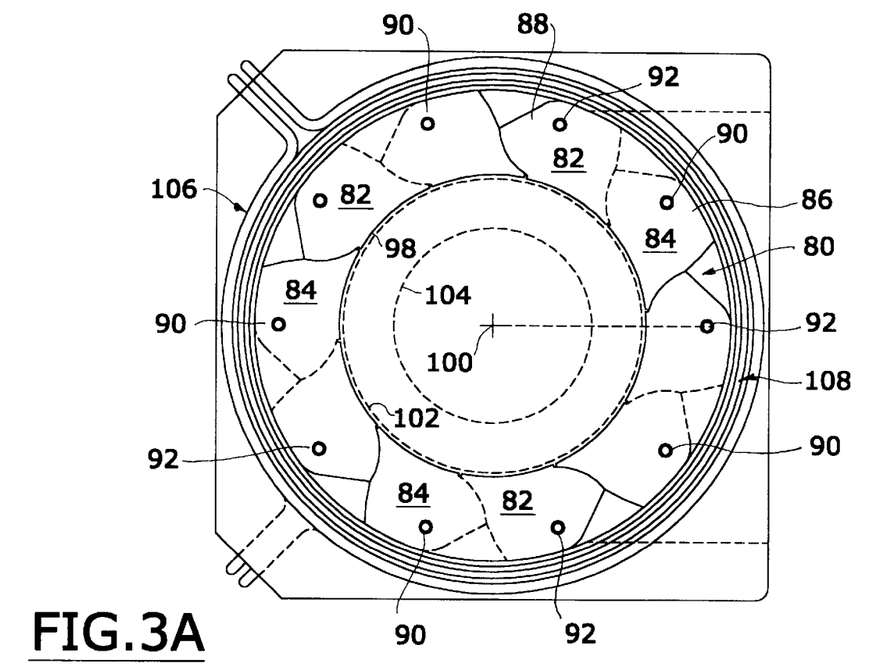
FIGS. 3A and 3B are similar views of an alternative shutter assembly in open and closed positions.
Figure 3B:
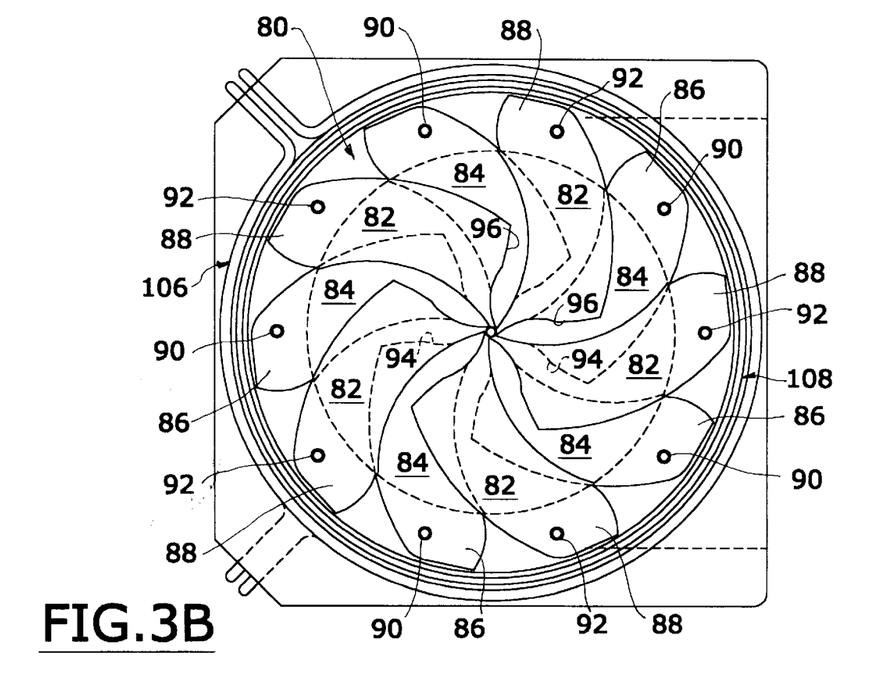

Layouts of the open and closed positions of an alternative shutter assembly 80 are provided by FIGS. 3A and 3B. Again, two sets of plates 82 and 84 are staggered in height (e.g., arranged in two closely spaced parallel planes) to provide clearance for varying overlap between adjacent plates. This alternative embodiment employs five shutter plates at a first vertical height and five more shutter plates located at a second vertical height. The numbers of shutter plates and shutter planes can vary depending on the PVD chamber, target, and substrate dimensions. Outer sections 86 and 88 of the plates 84 and 82 are mounted on pivots 90 and 92 (preferably pivots with rotational springs). Inner sections 96 and 94 of the plates 82 and 84 are rotatable about the pivots 90 and 92 from the position shown in FIG. 3A (shutter open) to the position shown in FIG. 3B (shutter closed). An opening 98 enveloped by the plates 82 and 84 in the open position is concentric with a central axis 100 and larger in diameter than either a target (shown as target image 102) or a substrate (shown as substrate image 104) mounted in a surrounding processing chamber 106. An actuator ring 108 removably attaches the shutter assembly 80 to the processing chamber 106 and transfers the shutter actuation motion to the plates 82 and 84 from a shutter actuator (not shown) for opening and closing the shutter. The shutter assembly embodiment shown in FIGS. 3A and 3B offers some advantages over the shutter embodiment shown in FIGS. 2A and 2B since the former uses less number of shutter plates (e.g., 10 instead of 12) and also it provides a substantially circular opening in the open position matching the peripheral shapes of the substrate, the process energy source, and the processing chamber. Again, the inner tips or ends of the shutter plates 82 and 84 can be made somewhat shorter in order to prevent interference among the shutter plates in the closed state. A small disk can be attached to the end tip of one of the shutter plates and placed at a third height (see FIG. 1) to cover the center hole when the shutter is closed. The small disk is connected to one of the plates 82 or 84 but positioned in a different plane to avoid mechanical interference.

Figure 4:
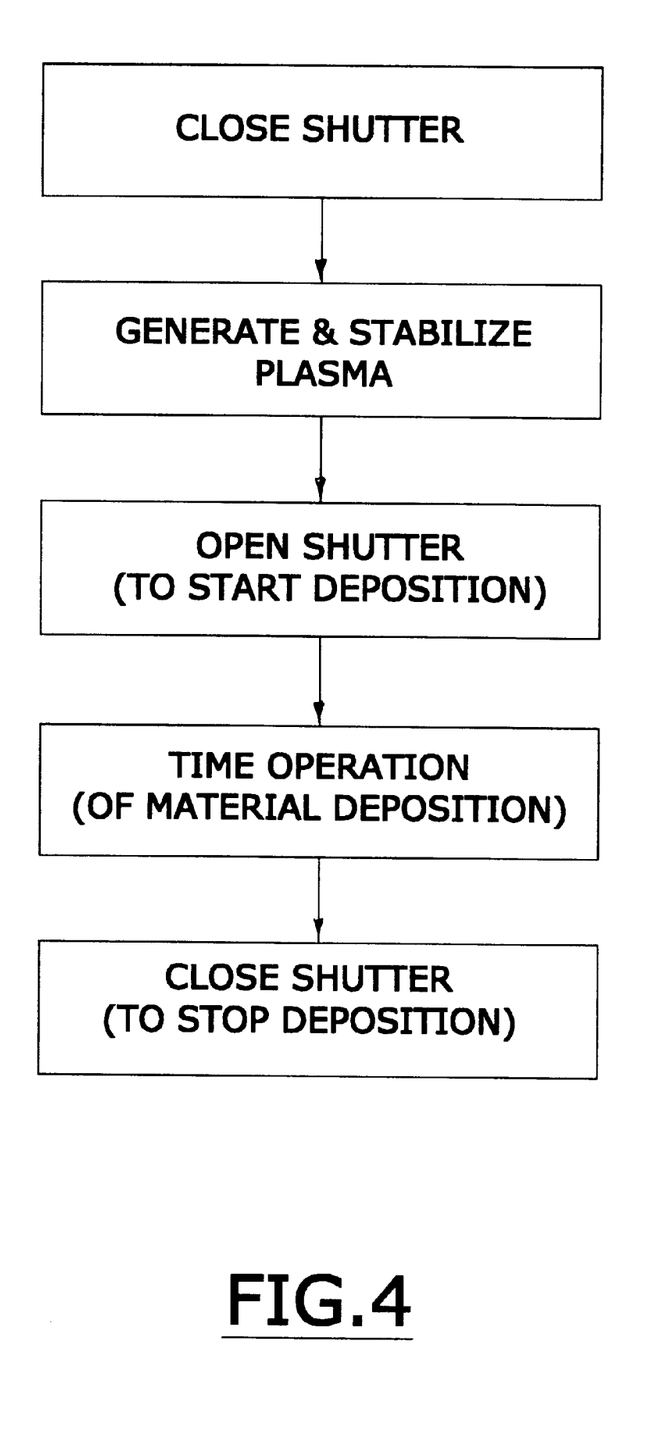
FIG. 4 is a diagram depicting a sequence of operations in thin-film deposition equipment for improving the repeatability and uniformity of substrate depositions.

Processing steps for a timing operation performed by a shutter assembly similar to the shutters 10 or 80 are listed in FIG. 4, although only the shutter 10 is referenced for purposes of this discussion. Prior to the onset of any PVD operations, the shutter 10 is closed, dividing the column of evacuatable space 40 into the first region 52 next to the substrate 26 and into the second region 54 next to the target 22. A bias voltage is applied to the target 22 to generate a plasma. After the plasma has stabilized, the shutter 10 is opened to allow line-of-sight transmissions and material depositions from the target 22 onto the substrate 26.

Processing continues for a predetermined length of time and is terminated by closing the shutter 10 prior to discontinuing the bias voltage. Thin-film material deposition occurs only after the plasma is fully stabilized in order to provide enhanced process control. The line-of-sight transmissions between the target 22 and the substrate 26 are interrupted by the opening and closing of the shutter 10 symmetrically with respect to a central axis 36 to further promote uniform depositions on the substrate 26. The axis-symmetry and fast actuation of the shutters of this invention eliminate any process uniformity degradations due to the shutter opening and closing operations. Other operations such as cleaning the substrate 26 and preparing the target 22 can also be performed with improved efficiency by opening and closing the shutter entirely within the processing chamber 12.

Figure 4A:
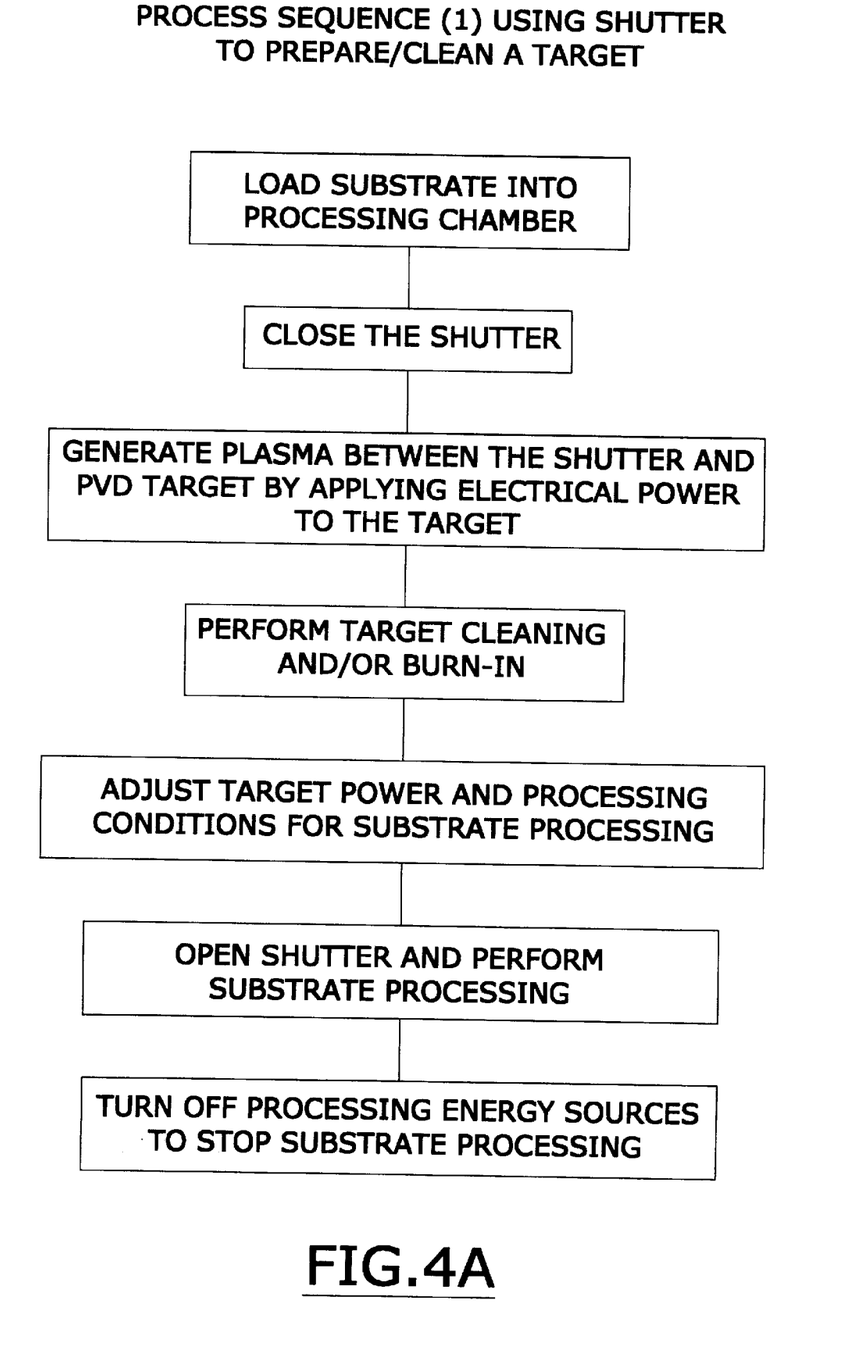
FIGS. 4A–4C are diagrams of three more detailed processing sequences using the shutter assembly of the preceding figures.
Figure 4B:
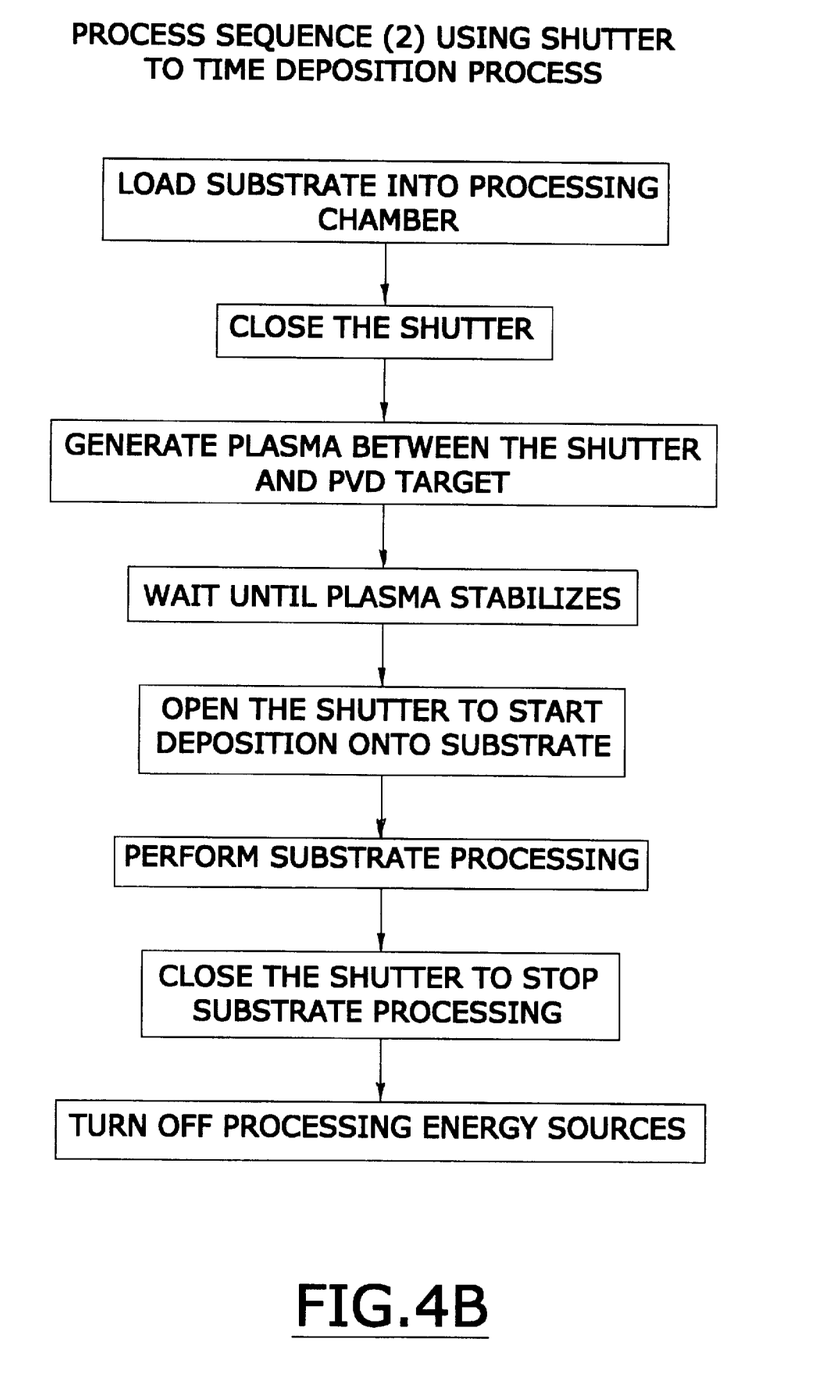
Figure 4C:
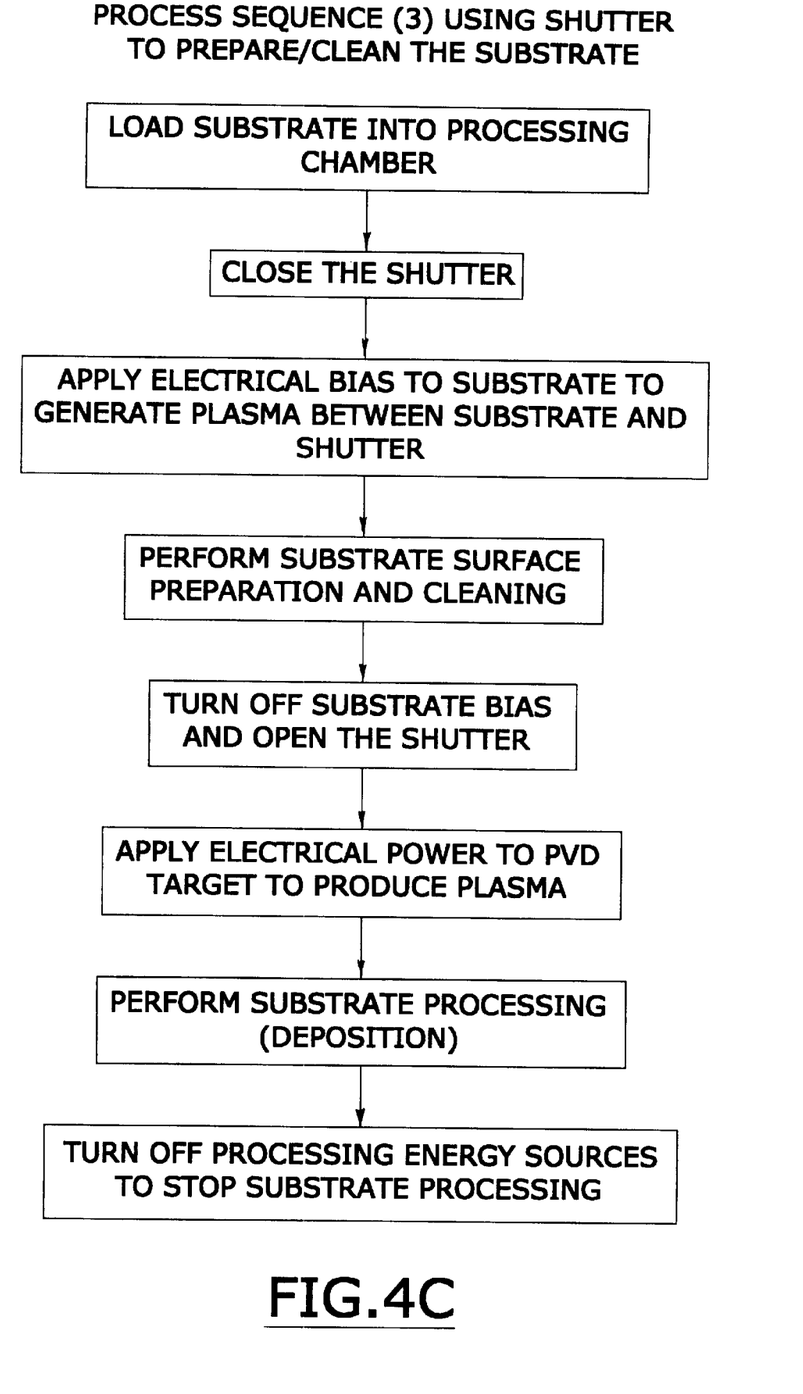

FIGS. 4A–4C show examples of three general proven sequences for PVD operations (such as plasma sputtering)

utilizing the shutter embodiments of this invention. The flow charts corresponding to FIGS. 4A, 4B, and 4C represent process sequences for PVD operations utilizing the shutter for target preparation (cleaning and/or burn-in), precision deposition process timing (e.g., for enhanced repeatability control of processes for deposition of very thin layers), and substrate surface preparations, respectively. Other process sequences are also possible. For instance, the shutter apparatus of this invention can be used to deposit multi-layer laminate structures (e.g., stack of multi-layer periodic metal and metal-oxide layers) by cycling the shutter between open and closed positions and cycling process gases (e.g., introducing oxygen with substrate bias when the shutter is closed).

The shutter plates of the shutter apparatus embodiments of this invention may be made of a suitable material such as stainless steel or titanium. The shutter plates may have textured or roughened surface (e.g., by depositing a rough arc spray coating of aluminum onto the plates) in order to extend their lifetime and reduce particle generation.

Figure 5:
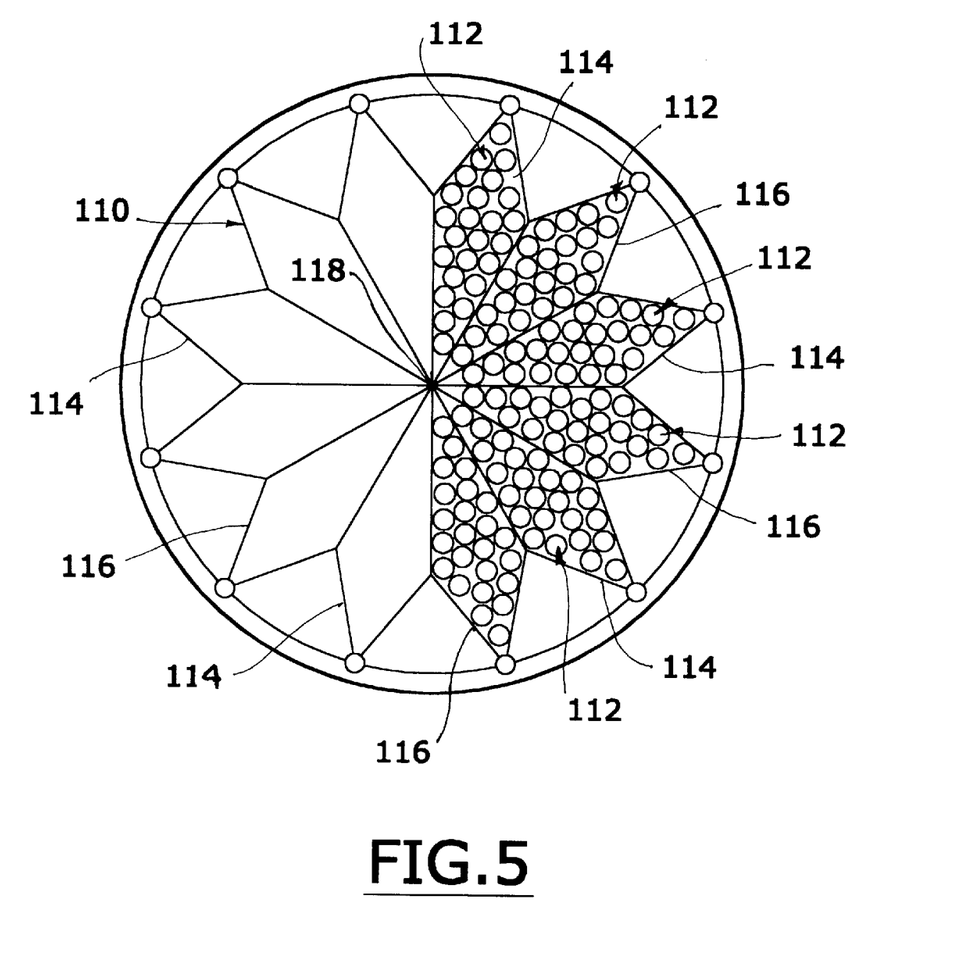
FIG. 5 is a plan view of a shutter assembly arranged with a plurality of openings for collimating line-of-sight transmissions between a target and a substrate.
Figure 6:
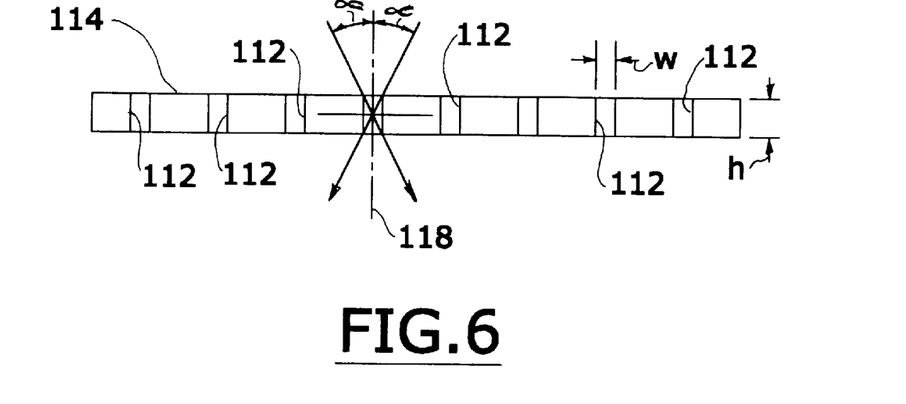
FIG. 6 is a cross-sectional view of a shutter assembly plate showing plate thickness in relation to opening width for limiting an angular range of the line-of-sight transmissions reaching the substrate in a physical-vapor deposition (PVD) process.

Instead of blocking line-of-sight transmissions between the target 22 and the substrate 26, a similar shutter design can be arranged as a collimator 110 as shown in FIGS. 5 and 6 for limiting incident angles α of the line-of-sight transmissions. When open, the collimator 110 is arranged similar to the shutter 10, permitting a full range of the line-of-sight transmissions from the target onto the substrate. When closed, however, an array of openings 112 in the alternating plates 114 and 116 have an aspect ratio of width or diameter "w" to thickness "t" to limit the angles of incidence α through which the line-of-sight transmissions impinge upon the substrate 26 in accordance with the following relationship:

$$\tan\alpha = \frac{w}{t}$$

The incident angles α are referenced with respect to a common centerline 118 of both the collimator 110 and a substrate (not shown). The openings 112 are closely packed and may be made circular or hexagonal (honeycomb) in shape. Other size, shape, and density of openings can also be used to transmit a limited range of incidence angles α. For example, the openings 112 can be arranged in a tightly packed honeycomb structure to maximize a total area occupied by the openings 112 (resulting in reduced waste of deposition material). More than one collimator with thinner plates can be used with openings in the two collimators aligned axially to limit the incidence angles α. The collimator 110 could also be used together with a shutter, such as the shutter 10, to provide even more control over line-of-sight target-to-substrate transmissions. The shuttering collimator apparatus of this invention allows both collimated and non-collimated deposition processes and/or PVD processes with various degrees of collimation within one process chamber.

Another application of the shutter apparatus of this invention is an in-situ shadow mask for PVD applications. The shadow mask pattern may be produced onto the shutter plates as patterns of openings corresponding to the desired deposition pattern onto the substrate. The shutter assembly is placed very close to the substrate plane. The masked deposition can be performed using PVD with the shutter closed. This results in replication of the shutter mask opening pattern onto the substrate. Normal blanket depositions can be performed with the shadow mask shutter open.

Another shutter assembly may be used above the shadow mask shutter (or between the shadow mask shutter and the PVD target) for normal PVD shutter operations (e.g., target and/or substrate preparations/cleanings).

While the shutter apparatus embodiments of this invention have been described as iris-type shutters within the process chamber, it should be understood that other embodiments of this invention are also possible. For instance, while the opening and closing of the shutter have been described based on designs that move the shutter plates along planes substantially parallel to the substrate and/or PVD target, other embodiments employing multi-axial movements of the shutter plates are also possible. The preferred embodiments of this invention employ planar shutter plates while other variations such as non-planar shutter plates can be used. The number of shutter plates can be chosen based on the dimensions of the process chamber, process energy source, substrate, and spacing between the process energy source and the substrate. Typically, the number of shutter plates is between 6 and 12 (smaller or larger numbers are also possible).

The shutter apparatus and methods of this invention are primarily applicable to the physical-vapor deposition (PVD) processes including plasma sputtering, ion-beam deposition, and cathodic-arc (vacuum arc) deposition methods. Moreover, their extended applications may include other thin-film fabrication processes such as plasma etching and plasma-enhanced chemical-vapor deposition (PECVD).

I claim:

1. A shutter apparatus for a thin-film processing system comprising:

a shutter assembly located substantially within the thin-film processing chamber between a process energy source and a substrate support;

articulatable components of the shutter assembly being movable relative to each other within said processing chamber to provide an open position to allow thin-film processing interaction between the process energy source and the substrate support and a closed position to isolate the process energy source from the substrate support; and a shutter actuator mechanism for actuating said shutter apparatus between said open and closed positions.

2. The shutter apparatus of claim 1 wherein said process energy source comprises a physical-vapor deposition process energy source.

3. The shutter apparatus of claim 1 wherein said process energy source comprises a plasma sputtering process energy source.

4. The shutter apparatus of claim 1 wherein said process energy source comprises an ion-beam deposition process energy source.

5. The shutter apparatus of claim 1 wherein said process energy source comprises a plasma etching process energy source.

6. The shutter apparatus of claim 1 in which said articulatable components include plates that are relatively movable between positions that vary an amount of overlap between said plates and vary a size of opening through which the thin-film processing interaction takes place.

7. The shutter apparatus of claim 6 in which said plates adjust the amount of overlap between an open position at which the amount of overlap is increased to a closed position at which the amount of overlap is decreased.

8. The shutter apparatus of claim 7 in which movement of said plates between said open and closed positions varies a size of an opening that is substantially centered within the processing chamber.

9. The shutter apparatus of claim 8 in which said plates include outer sections that are pivotably mounted next to a periphery of the processing chamber and inner sections that extend toward a center of the processing chamber for closing said centered opening.

10. The shutter apparatus of claim 9 in which said plates overlap each other in an alternating pattern between two parallel closed spaced planes.

11. The shutter apparatus of claim 10 wherein said two parallel planes have a spacing selected in the range of 0.5 mm and 5 mm.

12. The shutter apparatus of claim 9 wherein said outer sections of said plates are connected to rotational spring pivots.

13. The shutter apparatus of claim 9 wherein said rotational spring pivots are connected to a common pivot actuator component within said processing chamber.

14. The shutter apparatus of claim 9 in which one of said plates includes an extended portion for covering a center-most portion of the opening enclosed by said inner sections of the plates when the shutter is closed.

15. The shutter apparatus of claim 14 wherein said extended portion is a small disk connected to one of said plates and placed at a different plane to prevent mechanical interference.

16. The shutter apparatus of claim 7 further comprising a plate-shaped ring that overlaps said plates near a periphery of the processing chamber.

17. The shutter apparatus of claim 16 wherein the inner and outer peripheral dimensions of said ring are chosen such that the combination of said plates and ring provide complete partitioning of said processing chamber into a process energy source space and a substrate space in a closed position and provide a well-defined opening in an open position.

18. The shutter apparatus of claim 7 in which said plates are normally actuated into said open position and said actuator mechanism moves said plates into said closed position.

19. The shutter apparatus of claim 1 in which said actuator mechanism is a magnetically coupled actuator without a vacuum feedthrough.

20. The shutter apparatus of claim 1 in which said actuator mechanism is a mechanically coupled actuator with a vacuum feedthrough.

21. The shutter apparatus of claim 6 wherein said plates are made of a metallic material.

22. The shutter apparatus of claim 21 wherein said metallic material comprises stainless steel.

23. The shutter apparatus of claim 22 wherein said metallic material comprises titanium.

24. The shutter apparatus of claim 21 wherein said plates have roughened surfaces for extended lifetime.

25. The shutter apparatus of claim 24 wherein said roughened surfaces are formed by arc spraying of a metallic coating.

26. The shutter apparatus of claim 21 wherein said plates are connected to an electrical ground potential.

27. The shutter apparatus of claim 6 wherein said plates are movable within said processing chamber.

28. The shutter apparatus of claim 6 wherein said plates do not make any contact with one another during their relative motion and changes of overlap.

29. The shutter apparatus of claim 6 wherein said plates are arranged and operated as an iris.

30. The shutter apparatus of claim 7 wherein the planar area of said open position is larger than the area of said substrate.

31. The shutter apparatus of claim 7 wherein said plates are shaped in order to make the peripheral shape of said open position conformed to peripheral shape of said processing chamber.

32. The shutter apparatus of claim 7 wherein said plates are shaped in order to make the peripheral shape of said open position conformed to the peripheral shape of said process energy source.

33. The shutter apparatus of claim 7 wherein said plates are shaped in order to make the peripheral shape of said open position conformed to the peripheral shape of said substrate.

34. A shutter for processing of substrates within a thin-film processing chamber comprising:

a plurality of plates mountable within the chamber at a location that divides an axial column of space into two regions;

said plates being movable together between an open position that joins the two regions of space and a closed position that separates the two regions of space; and said plates being movable between said open and closed positions symmetrically with respect to a central axis of the axial column of space within the chamber.

35. The shutter of claim 34 wherein said plates comprise a pattern of openings corresponding to a desired thin-film deposition pattern in order to enable shadow mask processing.

36. The shutter of claim 34 in which said plates overlap each other by variable amounts for regulating a size of an opening centered along said central axis.

37. The shutter of claim 36 in which said plates alternate in height along said central axis within at least two substantially parallel and closely spaced planes.

38. The shutter of claim 36 in which said plurality of plates are pivotably mounted within the chamber.

39. The shutter of claim 38 in which said plates are arranged in a form of an iris for regulating a size of an opening centered along said central axis.

40. The shutter of claim 34 further comprising an actuator mechanism located outside the chamber and magnetically coupled to said plates without a vacuum mechanical feedthrough.

41. The shutter of claim 34 in which said plates include a plurality of openings for collimating transmissions of material species through said plates.

42. The shutter of claim 41 wherein the open and closed positions can be used to enable physical-vapor deposition processes with lower and higher degrees of collimations respectively.

43. A collimator system of a thin-film processing chamber for regulating angles of incidence through which deposits are made on a substrate comprising:

a plurality of articulatable components movable between an open position that permits passage of a first wider range of the incidence angles and a closed position that permits passage of a second narrower range of the incidence angles; and an actuator mechanism that moves said articulatable components between said open and closed positions.

44. The system of claim 43 in which said articulatable components are located substantially within the thin-film processing chamber.

45. The system of claim 44 in which said actuator mechanism controls the movement of said articulatable components via magnetic coupling independently of any direct mechanical linkage between said articulatable components and said drive mechanism.

46. The system of claim 43 in which said articulatable components include plates that are relatively movable between positions that vary an amount of overlap between said plates.

47. The system of claim 46 in which said plates adjust the amount of overlap between said open position at which the amount of overlap is increased to said closed position at which the amount of overlap is decreased.

48. The system of claim 47 in which movement of said plates between said open and closed positions varies a size of an opening that is substantially centered within the processing chamber.

49. The system of claim 48 in which said plates include outer sections that are pivotably mounted next to a periphery of the processing chamber and inner sections that extend toward a center of the processing chamber for closing said centered opening.

50. A method of processing a substrate within a thin-film processing chamber comprising the steps of:

closing a shutter blocking line-of-sight transmissions along an axis between a process energy source and a substrate within the thin-film processing chamber;

generating a plasma in the vicinity of the process energy source;

maintaining the shutter in a closed position until the plasma stabilizes; and progressively opening the shutter symmetrically about the central axis for exposing the substrate to transmissions from the process energy source.

51. The method of claim 50 including the further step of progressively closing the shutter symmetrically about the central axis to isolate the substrate from said process energy source.

52. The method of claim 51 in which said steps of progressively opening and progressively closing the shutter enables enhanced process uniformity and repeatability control.

53. The method of claim 50 in which said step of progressively opening the shutter is performed independently of any direct mechanical linkage outside the chamber.

54. The method of claim 50 including the further step of mounting the shutter on a periphery of the chamber.

55. A method of processing a substrate within a thin-film processing chamber comprising the steps of:

closing a shutter symmetrically along an axis between a process energy source and a substrate within the thin-film processing chamber;

generating a plasma in the vicinity of the substrate;

maintaining the shutter in a closed position and exposing said substrate to the plasma; and progressively opening the shutter symmetrically about the central axis for exposing the substrate to transmissions from the process energy source.

56. The method of claim 55 in which said step of progressively opening the shutter is performed independently of any direct mechanical linkage outside the chamber.

57. The method of claim 55 including the further step of mounting the shutter on a periphery of the chamber.

* * * * *